United States Patent [19]
Miyamoto et al.

[11] Patent Number: 5,138,581
[45] Date of Patent: Aug. 11, 1992

[54] MULTIPORT MEMORY

[75] Inventors: Shinji Miyamoto; Shigeo Ohshima, both of Yokohama, Japan

[73] Assignee: Kabushiki Kaisha Toshiba, Kawasaki, Japan

[21] Appl. No.: 577,361

[22] Filed: Sep. 5, 1990

[30] Foreign Application Priority Data

Sep. 5, 1989 [JP] Japan .................................. 1-229799

[51] Int. Cl.[5] .............................................. G11C 7/00
[52] U.S. Cl. .......................... 365/230.05; 365/189.11
[58] Field of Search .............. 365/189.11, 230.05, 365/230.09, 240, 190, 202, 204

[56] References Cited

U.S. PATENT DOCUMENTS

| 4,633,441 | 12/1986 | Ishimoto | 365/230.05 |
| 4,931,992 | 6/1990 | Ogihara et al. | 365/198.11 |
| 4,987,559 | 1/1991 | Miyauchi et al. | 365/230.05 X |

Primary Examiner—Joseph A. Popek
Attorney, Agent, or Firm—Foley & Lardner

[57] ABSTRACT

A multiport memory has a RAM port including a memory cell array having a plurality of memory cells arranged in a matrix form, sense amplifier circuit for sensing potential of a bit line after the storage potential has been transferred from the memory cells, restore circuit connected to the bit line for pulling up the potential of the bit line at the predetermined timing after sense operation has been started and a barrier circuit connected between the bit line and the sense amplifier circuit; and a SAM port including a data register, transfer gate and functional means for transferring serial data in the column direction. In this memory, the RAM port is connected to the SAM port by the transfer gate with the bit line directly connected to the data register, and the potentials at the bit line are amplified by the sense amplifier circuit and are directly transferred to the data register.

2 Claims, 3 Drawing Sheets

MULTIPORT MEMORY

BACKGROUND OF THE INVENTION

The present invention relates to a multiport memory.

A multiport memory is generally sued for image processing. Multiport memories used with high performance work stations, typically engineering work stations (EWS) or graphic work stations (GWS) are required to be accessible by CPU for 100% of the period while data are outputted to a display at high speed in order to realize high speed image processing and high speed image overwrite. Such a multiport memory is generally constructed with a random access memory port (hereinafter abbreviated as RAM port) and a serial access memory port (hereinafter abbreviated as SAM port). A RAM port is constructed with a memory cell array and its peripheral circuit, and a SAM port is constructed with a data register, serial data selector and their peripheral circuits. A multiport memory has a circuit arrangement that allows data transfer between a memory cell of the RAM port and the data register of the SAM port.

Such data transfer will be described with reference to FIG. 2. As the data stored in cell (not shown) of a RAM port is read, the potentials at bit lines BL10 and $\overline{BL10}$ connected to the memory cell changes. This change is potential is detected by a sense amplifier which is constructed with N-channel MOS transistors TN21, TN22, and TN23. Thereafter, a restore circuit 10 drives one of the bit lines BL10 and $\overline{BL10}$ to a potential "H" and the other to a potential "L", the restore circuit 10 being constructed of P-channel MOS transistors TP11, and TP12. In the data transfer mode, the potential (data in the memory cell) at the bit lines BL10 and $\overline{BL10}$ are sent via transfer gates TRG1 and TRG2 to a data register 30 which is constructed of P-channel MOS transistors TP31 and TP32 and N-channel MOS transistors TN31 and TN32. The data are then sent via bit lines BL12 and $\overline{BL12}$ and a serial data selector (not shown) to an external display. SAP in FIG. 2 indicates a restore control signal for bit lines, and $\phi_1$ indicates a sense amplifier control signal.

It is known in the art that in a general purpose DRAM, barrier transistors T1 and T2 are provided between the restore circuit 10 and sense amplifier 20 to sense data at high speed (refer to Japanese Laid-open No. 62-165787/1987). The sense operation by a RAM port of a conventional multiport memory is quite the same as that of a general purpose DRAM. Therefore, as shown in FIG. 3, it is possible to allow high speed operation at bit lines by providing barrier transistors T1 and T2 between a restore circuit 10 and sense amplifier 20.

With the barrier transistors T1 and T2 connected between the restore circuit 10 and sense amplifier 20, the restore circuit 10 drives one of the bit lines BL10 and $\overline{BL10}$, e.g., bit line BL10, directly connected to the memory cell to a "H" state of Vcc potential. However, the potential at a node BL11 on the a sense amplifier 20 side rises only to a value (Vcc$-V_T$) because of the threshold value $V_T$ of the barrier transistor T1. Consider the case where an inverse data is transferred from the RAM port to the SAM port, e.g., the case where the data with the potential "H" at the bit line $\overline{BL10}$ and "L" at the bit line BL10 is transferred under the condition that the potential at a node BL12 of the SAM port is "L" and that at a node $\overline{BL12}$ is "H". In such a case there may occur an erroneous data transfer may occur. For example, assuming that the potential at the node BL11 is "L" and that at the node $\overline{BL12}$ is "H", if the transfer gate TRG2 is turned or such that the potential at the node $\overline{BL12}$ is made "L" by the on-state transistor TN22 of the sense amplifier 20, charges are transferred to the nodes $\overline{BL11}$ and $\overline{BL12}$ via the transistor TP32 of the data register 30. Since the barrier transistors T1 and T2 are provided for realizing high speed sensing, the capacitance of the $C_{\overline{BL11}}$ of the node $\overline{BL11}$ is smaller than the capacitance $C_{\overline{BL12}}$ of the node $\overline{BL12}$. Accordingly, as charges are transferred from the transistor TP32 to the nodes $\overline{BL11}$ and $\overline{BL12}$, the potential at the node $\overline{BL11}$ rises by a ratio of capacitances of the nodes $\overline{BL11}$ and $\overline{BL12}$, and the off-state transistor TN21 turns on. The potential at the node BL11 which has been in an "H" state becomes "L" so that the potential at node BL12 cannot be made "H". In other words, the potential on the SAM port side cannot be inverted and hence data transfer is impossible.

SUMMARY OF THE INVENTION

It is therefore an object of the present invention to provide a multiport memory capable of reliably transferring data from a RAM port to an SAM port while retaining high speed sensing of bit lines of the RAM port.

According to the present invention, there is provided a multiport memory having a RAM port including a memory cell array having a plurality of memory cells arranged in matrix form, sense amplifier means for sensing the potential of a bit line after the storage potential transferred from the memory cells, restore means connected to the bit line for pulling up the potential of the bit line at the predetermined timing after the sense operation is started and barrier means connected between said the bit line and said the sense amplifier means; and a SAM port including a data register, transfer means and functional means for transferring serial data in column direction where the RAM port is connected to the SAM port by the transfer means with the bit line directly connected to the data register, and the potential at the bit line is amplified by the sense amplifier means and is directly transferred to the data register.

According to the multiport memory of the invention, the circuit connection is established such that the potential amplified and latched by the sense amplifier are directly coupled to the data register via the transfer gates. With such a circuit arrangement of a multiport memory having tarrier transistors for the purpose of high speed, the bit line capacitance on the RAM port side connected to the transfer gate becomes sufficiently large. Therefore, data transfer from the RAM port to the SAM port can be reliably executed while retaining high speed sensing.

BRIEF DESCRIPTION OF THE DRAWINGS

In the accompanying drawings.

DESCRIPTION OF THE PREFERRED EMBODIMENT

Figure 1:
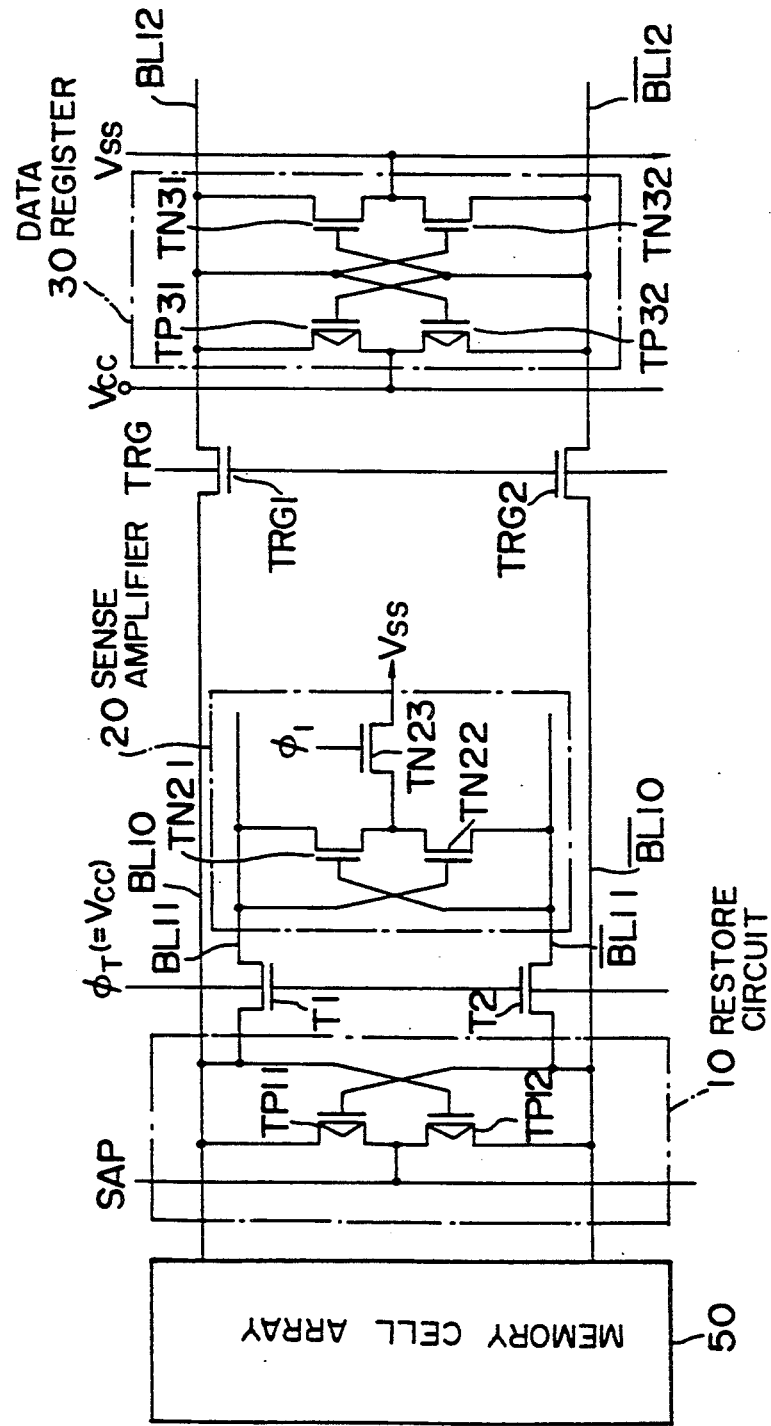
FIG. 1 is a circuit diagram showing an embodiment of the multiport memory according to the present invention.
Figure 2:
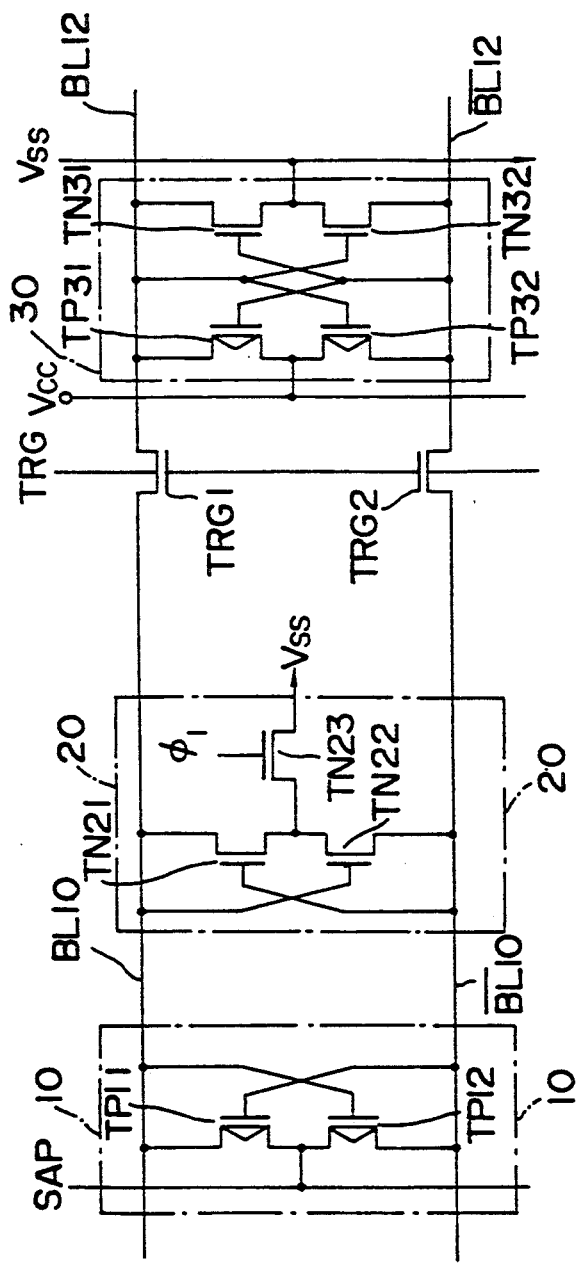
FIG. 2 is a circuit diagram showing a conventional multiport memory.

An embodiment of the multiport memory of this invention is shown in FIG. 1. The multiport memory of this invention includes a RAM port and an SAM port. The RAM port includes a memory cell array 50 having a plurality of memory cells disposed in a matrix, a restore circuit 10, barrier transistors T1 and T2, and a sense amplifier 20. The restore circuit 10 is constructed of P-channel MOS transistors TP11 and TP12 with cross gate connection, and the sense amplifier 10 is constructed of N-channel MOS transistors TN21 and TN22 with cross gate connection, and an N-channel MOS transistor TN23 having a gate supplied with a control signal $\phi_1$ and connected between Vss and the interconnection between the transistors TN21 and TN22. The SAM port is constructed of transfer gates TRG1 and TRG2 and a data register 30. The data register 30 is constructed of P-channel MOS transistors TP31 and TP32 with cross gate connection and N-channel MOS transistors TK31 and TN32 with cross gate connection.

Different conventional multiport memory, in this embodiment of the multiport memory, the data register 30 is directly coupled via the transfer gates TRG1 and TRG2 to the bit lines BL10 and $\overline{BL10}$. Specifically, bit lines connected to a memory cell row of the memory cell array, e.g., bit lines BL10 and $\overline{BL10}$ are connected to one terminals of drains or sources of the transfer gates TRG1 and TRG2, and the other terminals thereof are connected to nodes BL12 and $\overline{BL12}$ to which the data register 30 of the SAM port is connected.

Figure 3:
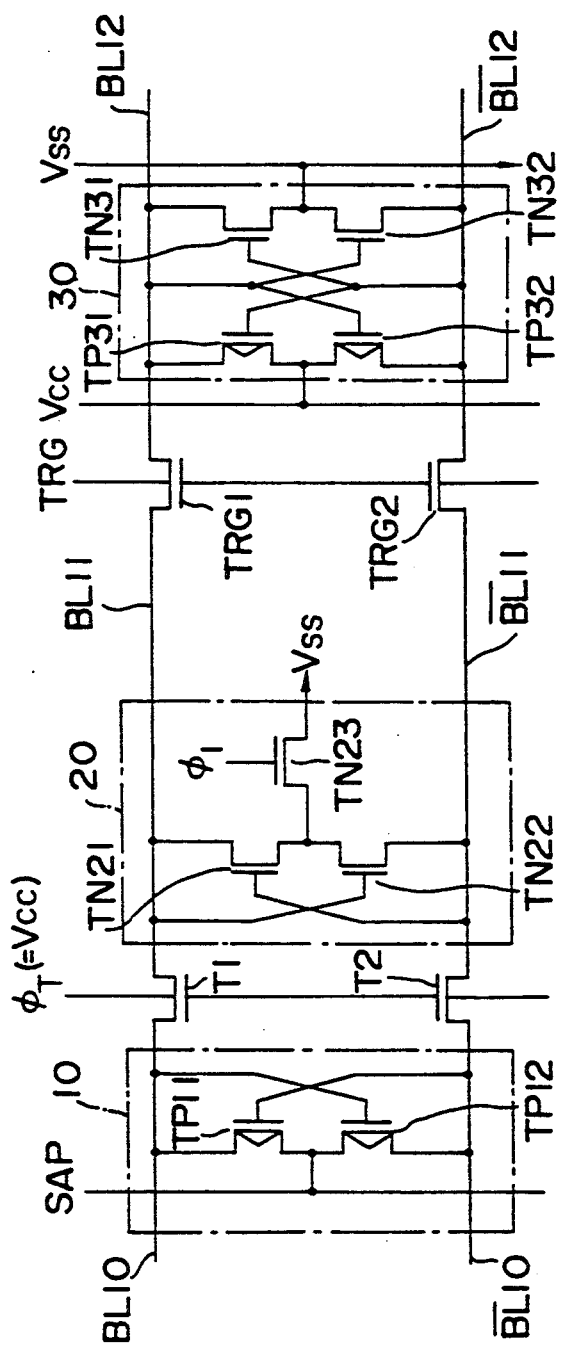
FIG. 3 is a circuit diagram of a conventional multiport memory having barrier transistors.

Similar to the conventional multiport memory shown in FIG. 3, the barrier transistors T1 and T2 are provided between the sense amplifier and bit lines, the conduction of the barrier transistors being controlled by a restore control signal $\phi_T$.

In this embodiment, however, one terminal of the transfer gate TRG1 is directly connected to the bit line BL10 and one terminal of the transfer gate TRG2 a directly connected to the bit line $\overline{BL10}$ so that the potentials at the bit lines BL10 and $\overline{BL10}$ amplified and latched by the sense amplifier 10 are directly transferred via the transfer gates TRG1 and TRG2 to the data register 30. As a result, the capacitances $C_{BL10}$ and $C_{\overline{BL}10}$ of the bit lines BL10 and $\overline{BL10}$ are added to the terminals of the transfer gates TRG1 and TRG2 on the RAM port side. In transferring an inverse data from the RAM port to the SAM port, it becomes therefore possible to suppress the rise in potential at the terminal of the transfer gate TRG1 or TRG2 on the RAM port side having a potential level of "L", to thereby ensure reliable data transfer.

What is claimed is:

1. A multiport memory comprising:
   a random access memory port including a memory cell array having a plurality of memory cells arranged in a matrix form;
   sense amplifier means for sensing potential of a bit line after a potential indicative of stored data is transferred from said memory cells;
   restore means connected to said bit line for pulling up the potential of said bit line after a predetermined timing when a sense operation has started and barrier means has been connected between said bit line and said sense amplifier means; and
   a serial access memory port including a data register and transfer means for transferring serial data between said restore means and said serial access memory port;
   said bit line in said random access memory port being directly connected to said data register in said serial access memory port through said transfer means, and
   the potential at said bit line amplified by said sense amplifier means being directly transferred to said data register.

2. A multiport memory according to claim 1, wherein said transfer means is a transfer gate.

* * * * *